(12) United States Patent
Toyama et al.

(10) Patent No.: US 6,501,633 B1
(45) Date of Patent: Dec. 31, 2002

(54) WIRING BOARD AND ELECTRONIC DEVICE HAVING CIRCUIT BOARD

(75) Inventors: Kenji Toyama, Kawasaki (JP); Koichi Yokoyama, Tokyo (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/494,533

(22) Filed: Jan. 31, 2000

(30) Foreign Application Priority Data

Feb. 2, 1999 (JP) .......................................... 11-025122

(51) Int. Cl.$^7$ .............................................. H01H 73/00
(52) U.S. Cl. ..................... 361/115; 361/731; 361/760
(58) Field of Search ................................. 361/115, 760, 361/731

(56) References Cited

U.S. PATENT DOCUMENTS 5,982,655 A * 11/1999 Doyle .................. 365/189.05
6,004,139 A * 12/1999 Dramstad et al. ............. 439/59

FOREIGN PATENT DOCUMENTS

| JP | 6-243028 | 9/1994 |
| JP | 8-241245 | 9/1996 |
| JP | 9-180431 | 7/1997 |

* cited by examiner

Primary Examiner—Stephen W. Jackson
(74) Attorney, Agent, or Firm—Staas & Halsey LLP

(57) ABSTRACT

A wiring board according to the present invention includes a mounting region in which memories having different storage capacities can be mounted. The mounting region has: first wires for, when a first memory is mounted, making it possible to access all the addresses of the first memory; and second wires for, when a second memory having a storage capacity different from that of the first memory, making it possible to access to all the addresses of the second memory. For this reason, before an electronic device on which the wiring board is mounted is shipped, a memory mounted in the mounting region can be selected depending on the demand of a user.

7 Claims, 6 Drawing Sheets

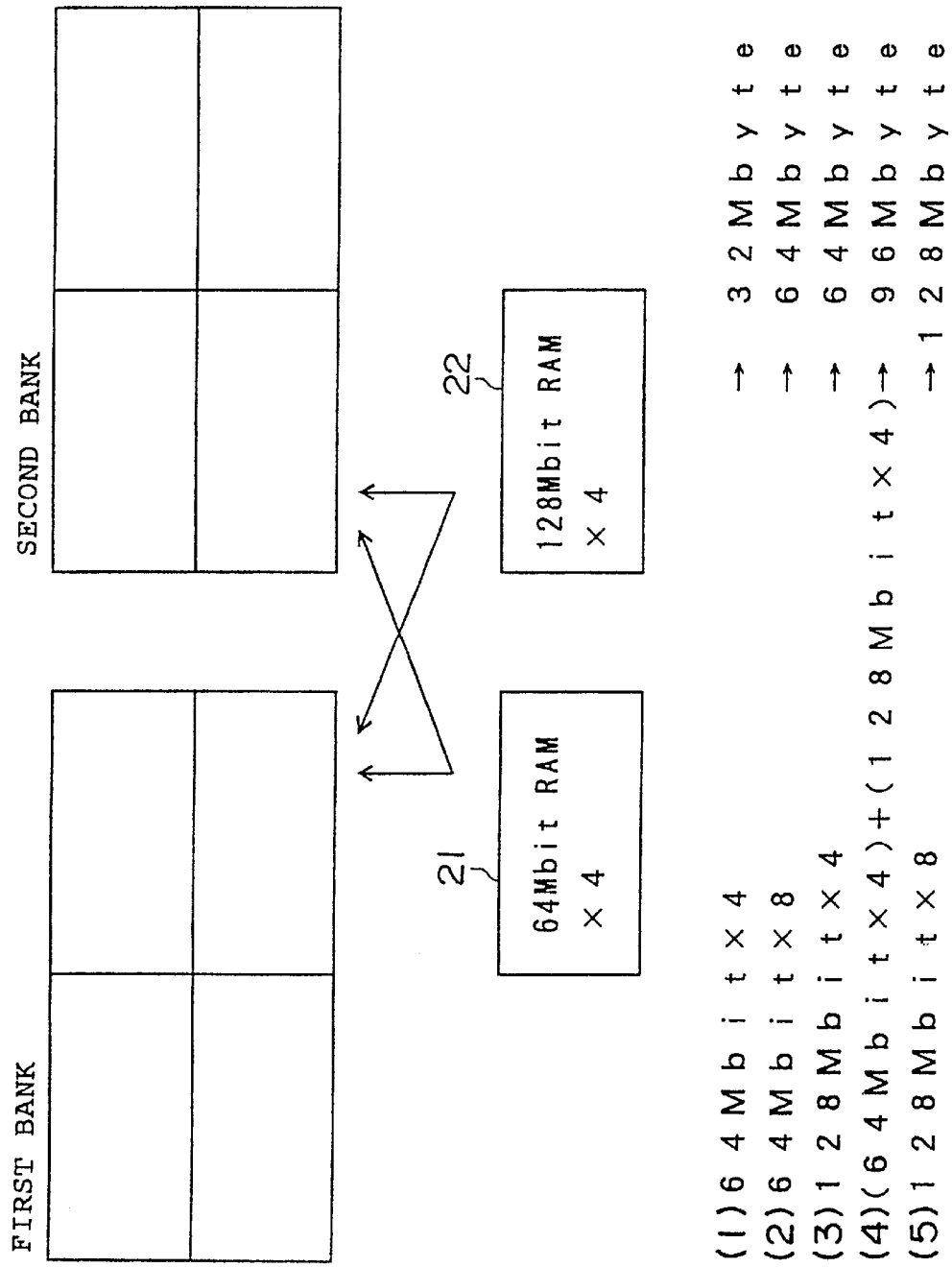

WIRING BOARD AND ELECTRONIC DEVICE HAVING CIRCUIT BOARD

BACKGROUND OF THE INVENTION

1. Field of the Invention

The present invention relates to a wiring board having a mounting region for a memory and an electronic device on which the wiring board is mounted.

2. Prior Art

Main circuit parts such as processors (CPU or the like), a main memory, and the like constituting an electronic device such as a computer are mounted on a basic circuit board (wiring board) called a mother board, and the basic circuit board is accommodated in the main body of the electronic device.

The main memory is a RAM (DRAM chip) mainly used as a work area of the CPU, is mounted on a mounting portion (called a "pad"), formed on a mother board, for the main memory, and is electrically connected to another circuit through wires connected to the pad.

When an electronic device is to be manufactured, a main memory having a specification (configuration or the like of a storage element constituting a storage capacity and a main memory bank) selected by a maker or a vender such as a seller is mounted on a mother board. On the mother board, necessary electronic circuit parts are mounted. Thereafter, the mother board on which the necessary parts are mounted is mounted on the main body of the electronic device. When the electronic device is in a state in which the electronic device can be shipped, the electronic device is shipped.

As described above, a main memory having a specific specification selected by a vender is mounted (soldered) on the mother board until the electronic device is shipped. A user can expand the work area of the CPU by adding an expanded memory after the electronic device is purchased. For this reason, it is not expected that the main memory is exchanged after the electronic device is purchased by the user.

For this reason, wires (including pads) for a main memory of a mother board are formed such that only a specific main memory can be mounted. More specifically, a main memory has only one specification corresponding to one type of mother board.

With a great variety of computer systems in recent years, users require a great variety of specifications of electronic devices such as computers, and the demands of the users extent to the storage capacities of main memories mounted in a shipping state. For example, a user who wants to make the processing speed of a CPU as high as possible desires that a main memory having a capacity which is as large as possible is mounted. On the other hand, a user who wants to, even slightly, suppress the price of an electronic device desires a reduction in price of the electronic device in place of a reduction in storage capacity of the main memory.

However, only a main memory can mounted on a conventional mother board. For this reason, the conventional mother board can respond to the demand of a user. In addition, if the specification of the main memory is changed in response to the demand of a user, mother boards must be prepared for the specifications of main memories, respectively. High costs and long time are required.

SUMMARY OF THE INVENTION

It is an object of the present invention to provide a wiring board being capable of supplying an electronic device depending on a demand of a user by making it possible to select the storage capacity of a memory mounted before shipment and an electronic device comprising the wiring board.

The first aspect of the present invention is a wiring board including a mounting region in which memories having different storage capacities can be mounted. The mounting region has: first wires for, when a first memory is mounted, making it possible to access all the addresses of the first memory; and second wires for, when a second memory having a storage capacity different from that of the first memory, making it possible to access to all the addresses of the second memory.

According to the first aspect of the present invention, one of the first memory and the second memory can be mounted in the mounting region. For this reason, the total capacity of the memory mounted in the mounting region, i.e., the total capacity of the main memory can be changed. Therefore, the total capacity of the main memory can be selected depending on a demand of a user.

The memory mounted in the mounting region is a main memory (to be referred to as an internal memory, an internal RAM, a system RAM, or the like) which is mounted before an electronic device having the wiring board of the present invention mounted thereon is shipped by a vender and which is not expected to be exchanged. The memory does not include an expanded memory (expanded RAM) added by a user or the like after the electronic device having the wiring board mounted thereon is shipped. The wiring board of the present invention has a plurality of mounting regions, and at least one of the plurality of mounting regions or all the plurality of mounting regions may have the configurations described above.

In the first aspect, the mounting regions may be formed on both the surfaces of the wiring board. In this manner, the spaces on the wiring board can be effectively used.

In the first aspect, the first memory may be constituted by a plurality of storage elements, and the first wires may be electrically connected to the storage elements constituting the first memory, the second memory may be constituted by a plurality of storage elements, having the same bit configurations as those of the storage elements constituting the first memory, the number of which is equal to that of the storage elements of the first memory, and the second wires may be electrically connected to the storage elements constituting the second memory.

In the first aspect, the first wires and the second wires may have portions which are commonly used for the first memory and the second memory.

The second aspect of the present invention is an electronic device including a wiring board. This wiring board includes a mounting region in which memories having different storage capacities can be mounted. The mounting region has: first wires for, when a first memory is mounted, making it possible to access all the addresses of the first memory; and second wires for, when a second memory having a storage capacity different from that of the first memory, making it possible to access to all the addresses of the second memory.

An electronic device has a wiring board on which a memory conforming to the definition described above is mounted, and is a personal computer, a work station, a mobile computer, or the like.

According to the wiring board according to the present invention and the electronic device including the wiring board, the storage capacity of a memory mounted before shipment can be selected. An electronic device depending on a demand of a user can be supplied to the user.

BRIEF DESCRIPTION OF THE DRAWINGS

FIG. 6 is a diagram for explaining determination of the total capacity of the main memory.

DETAILED DESCRIPTION OF THE PREFERRED EMBODIMENT

An embodiment of the present invention will be described below with reference to the accompanying drawings.

Figure 1:
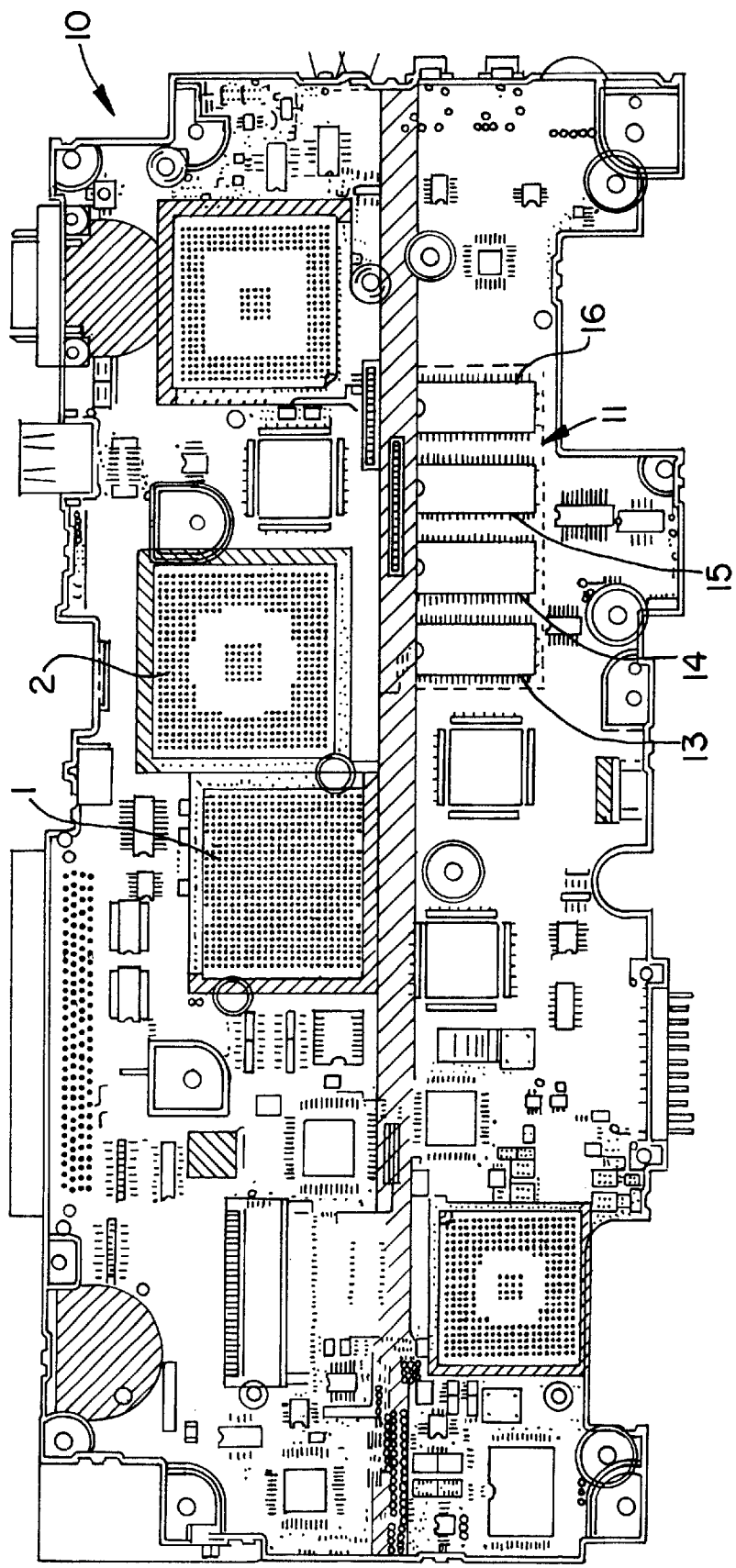
FIG. 1 is a front-surface view of a mother board according to an embodiment of the present invention.
Figure 2:
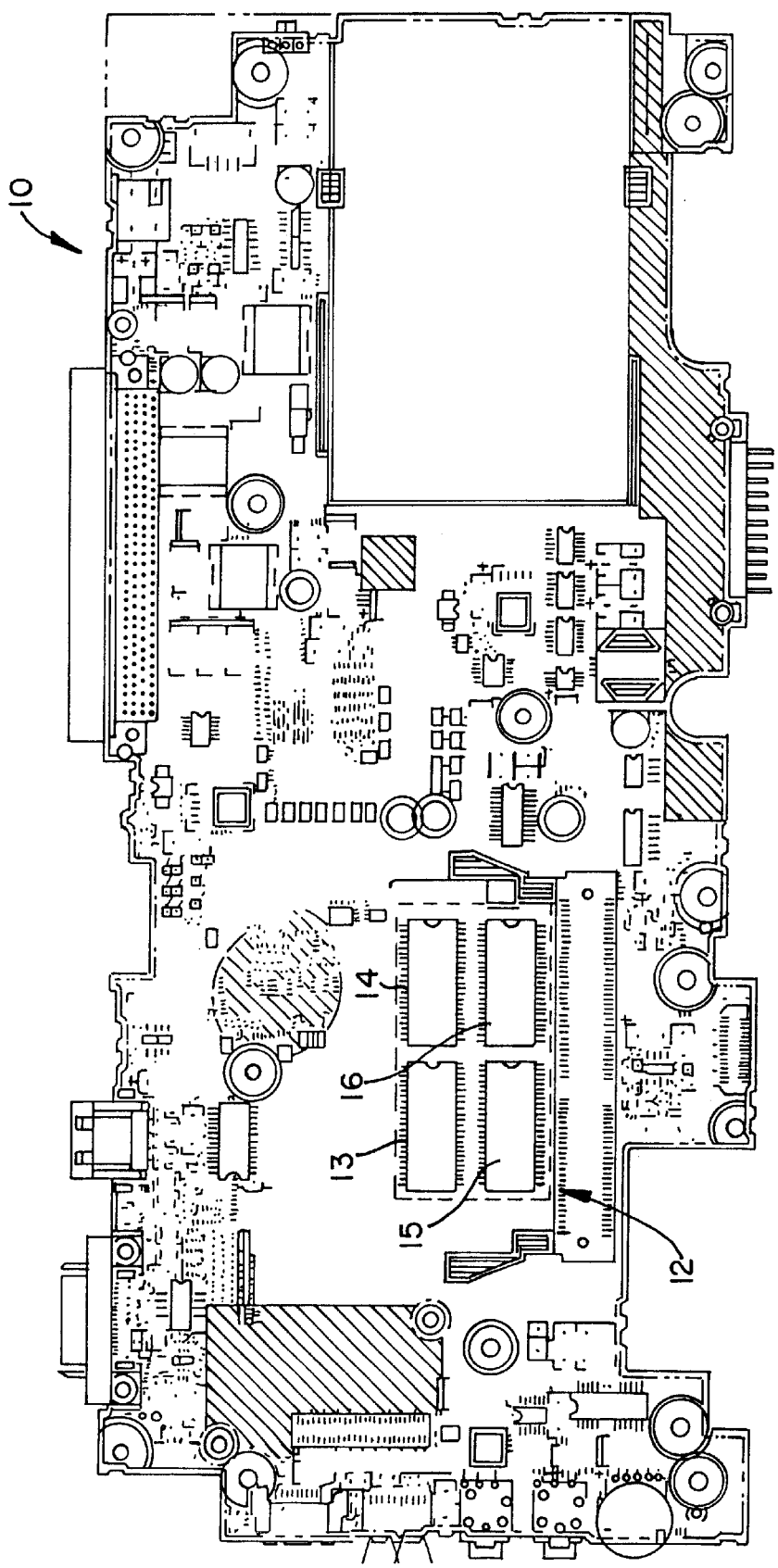
FIG. 2 is a rear-surface view of the mother board shown in FIG. 1.
Figure 3:
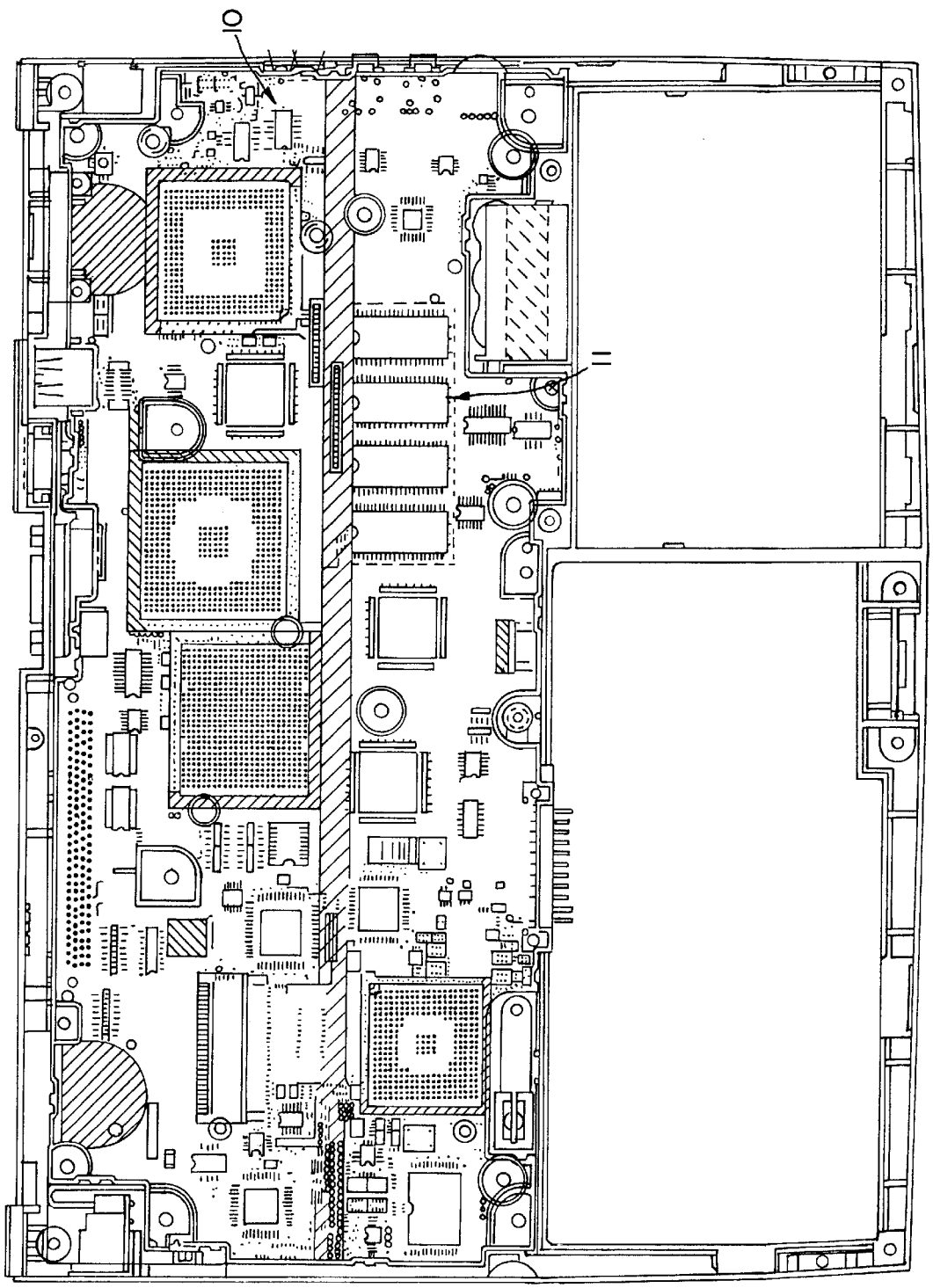
FIG. 3 is a plan view showing a state in which the mother board shown in FIG. 1 is accommodated in the main body of a computer.
Figure 4:
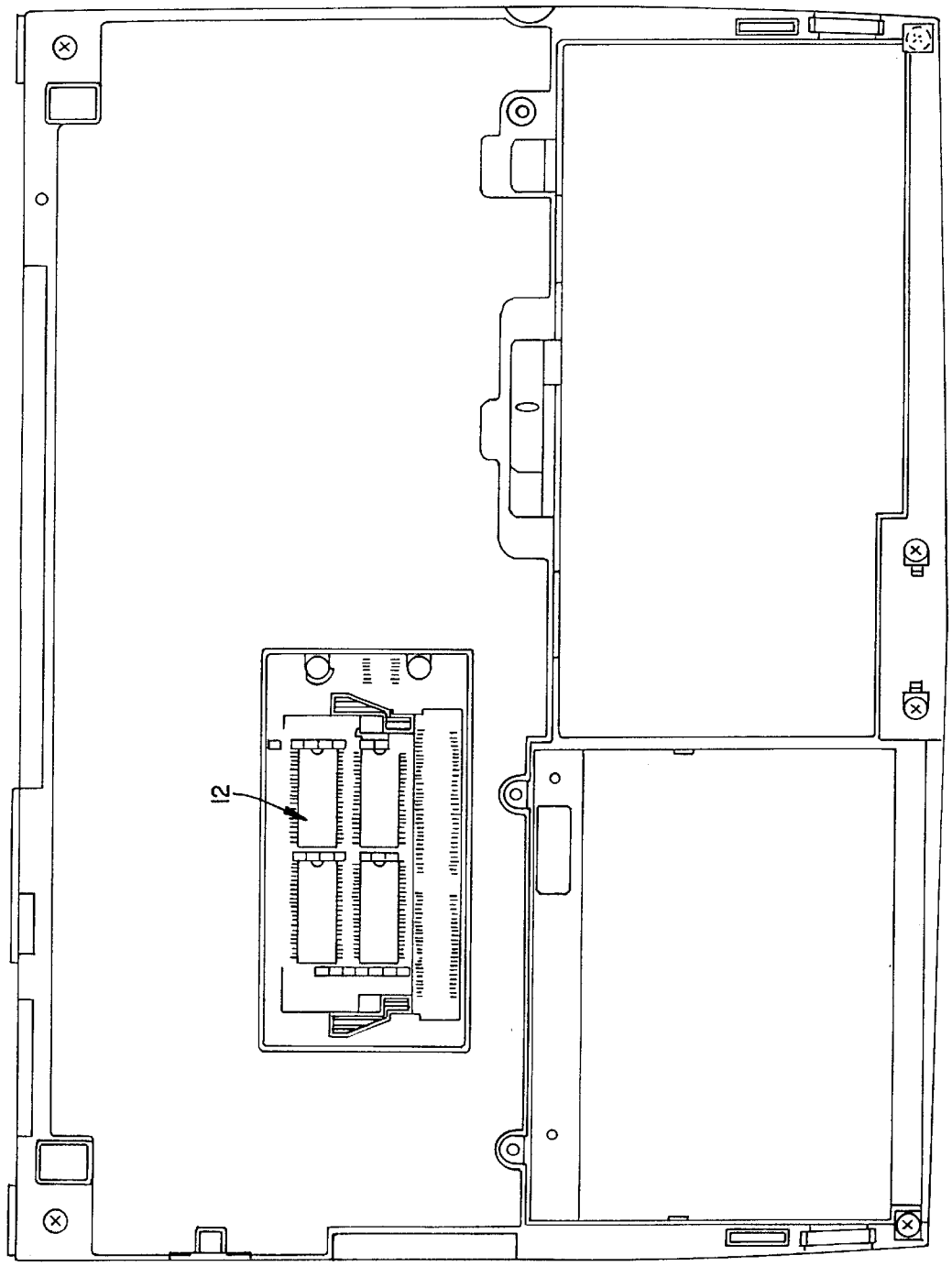
FIG. 4 is a bottom view of the main body of the computer shown in FIG. 3.
Figure 5:
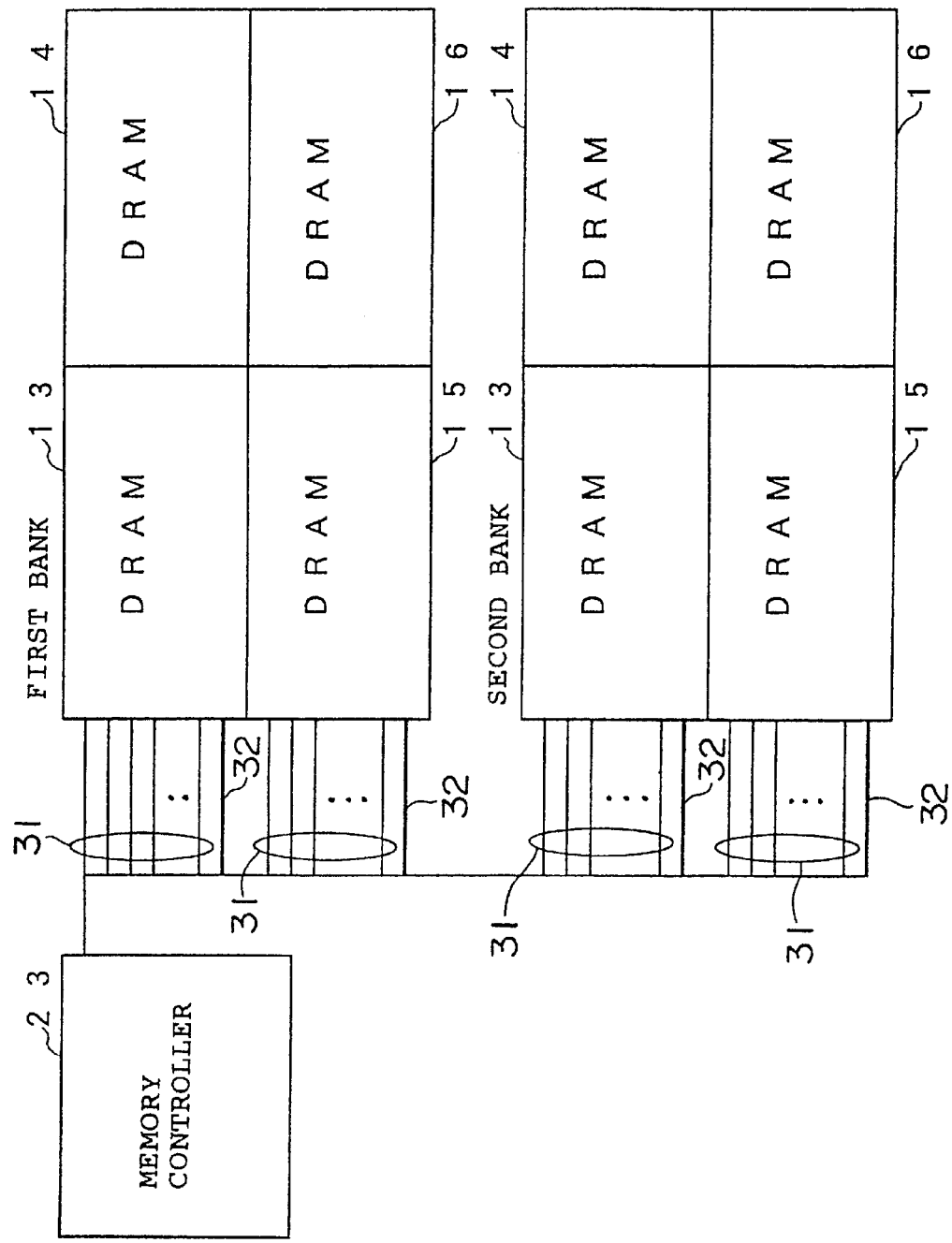
FIG. 5 is a block diagram showing a part of the circuit configuration of the mother board shown in FIG. 1.

FIG. 1 is a front-surface view of a mother board 10 serving as a wiring board according to the embodiment of the present invention. FIG. 2 is a rear-surface view of the mother board 10 shown in FIG. 1. FIG. 3 is a plan view showing a state in which the mother board shown in FIG. 1 is accommodated in the main body of a computer. FIG. 4 is a bottom view of the main body of the computer shown in FIG. 3. FIG. 5 is a block diagram showing a part of the circuit configuration of the mother board shown in FIG. 1.

An electronic device to which the mother board 10 according to this embodiment is applied is, e.g., a notebook type personal computer (PC) as shown in FIG. 3 and FIG. 4. This personal computer is designed to be operated by a CPU corresponding to a 64-bit data bus width.

As shown in FIG. 1 and FIG. 2, the mother board 10 is formed such that a circuit pattern depending on a predetermined circuit arrangement is formed on a board material. In the mother board 10, a wiring structure using copper is formed. In this manner, when a processor such as a CPU, circuit chips such as a controller and a ROM, and circuit elements are mounted on the mother board 10, these circuit chips and these circuit elements are electrically connected to each other according to a predetermined design.

On the mother board 10, a socket for mounting a predetermined circuit chip is formed. For example, on the front surface of the mother board 10, a mounting region (socket) 1 for the CPU and a mounting region (socket) 2 for a memory controller 23 (see FIG. 5) are formed.

On the right side of the center of the front surface of the mother board 10 shown in FIG. 1, a first memory mounting region (to be referred to as a "first mounting region" hereinafter: corresponding to a mounting region) 11 is formed. On the other hand, on the right side of the center of the rear surface of the mother board 10 shown in FIG. 2, a second memory mounting region (to be referred to as a "second mounting region" hereinafter: corresponding to a mounting region) 12 is formed.

As described above, the first memory mounting region 11 and the second memory mounting region 12 are closely arranged through a board material, and main memories are mounted on both the surfaces of the board material. In this manner, the spaces of the mother board 10 can be effectively used.

The first memory mounting region 11 and the second memory mounting region 12 have almost similar configurations except that the arrangements of storage elements (DRAM chips) constituting memory banks mounted in the first memory mounting region 11 and the second memory mounting region 12. For this reason, the first memory mounting region 11 will be described as an example.

In the first memory mounting region 11, a memory bank (memory module) obtained by connecting the four same DRAM chips to each other is mounted. On the mother board 10 according to this embodiment, as a memory bank, a first memory bank 21 (see FIG. 6) in which each DRAM chip has a storage capacity of 64 Mbit and a second memory bank 22 (see FIG. 6) in which each DRAM chip has a storage capacity of 128 Mbit can be mounted. More specifically, in the first memory mounting region 11 and the second memory mounting region 12, the first memory bank 21 and the second memory bank 22 having the following configurations (specifications) can be mounted.

64 Mbit: (4 MW (word)×16 bit)×4

128 Mbit: (8 MW (word)×16 bit)×4

Each portion of "16 bit" in the above configuration is called a bit configuration of a word. In the first memory mounting region 11, the first memory bank 21 and the second memory bank 22 having the same bit configurations can be mounted. For example, MB81F641642C-103FN available from Fujitsu Ltd. is used as the first memory bank 21, and M2V28S20TP-7 available from Mitsubishi Electric Corp. is used as the second memory bank 22.

For this reason, four common pads 13 to 16 are formed on the first memory mounting region 11. DRAM chips constituting the first memory bank 21 and the second memory bank 22 are mounted on the common pads 13 to 16.

The pads 13 to 16 are connected to first wires 31 (see FIG. 5) for electrically connecting the DRAM chips to a predetermined circuit (processor, controller, or the like) when the first memory bank 21 is mounted and to second wires 32 (see FIG. 5) for electrically connecting the DRAM chips to a predetermined circuit when the second memory bank 22 is mounted.

Therefore, the second wires 32 are electrically connected to a memory bank only when the second memory bank 22 is mounted in the first memory mounting region 11.

As shown in FIG. 5, the first wires 31 and the second wires 32 are constituted by a plurality of address lines. The address lines are formed such that objects (memory controller 23, DMA (direct memory access), CPU, and the like) which access the main memory access the addresses of the DRAM chips of the first memory bank 21 or the second memory bank 22.

The address lines are formed in accordance with the DRAM chips. In FIG. 5, the first wires 31 and the second wires 32 for the DRAM chips mounted on the pads 14 and 16 are omitted.

The second wires 32 are formed such that wires required when the second memory bank 22 is mounted are added to the first wires 31 for mounting the first memory bank 21. Some of the first wires 31 are used as address line for the second memory bank 22.

In this embodiment, when one address line and a pad for the second memory bank 22 are added to the first wires 31, the second wires 32 are formed. With this configuration, the memory controller 23 can access (write and read data) all the addresses of the first memory bank 21 or the second memory bank 22 mounted in the first and second memory mounting regions 11 and 12.

The memory banks mounted in the first memory mounting region 11 and the second memory mounting region 12 constitutes banks serving as units which a processor or a controller can access at once. More specifically, the memory bank mounted in the first memory mounting region 11 constitutes a first bank, and the memory bank mounted in the second memory mounting region 12 constitutes a second bank.

Bank switching is properly performed such that the processor or the controller cannot access the second bank when the processor or the controller accesses the first bank and the processor or the controller cannot access the first bank when the processor or the controller access the second bank. The first memory bank 21 and the second memory bank 22 are mainly accessed by the memory controller 23.

As shown in FIG. 3, when the mother board 10 is accommodated in the main body of the personal computer, the front surface of the mother board 10 can be visually recognized from the outside when the upper cover, the keyboard, and heat-radiation fins are removed from the main body of the personal computer.

As shown in FIG. 4, the memory bank mounted in the second memory mounting region 12 can be visually recognized from the outside when a lid (fixed with screws) for a DIMM (Dual In-line Memory Module) socket arranged on the bottom surface of the main body of the personal computer.

With the above configuration, a vender can select a total capacity of a main memory mounted on the mother board 10 from several patterns by selecting one of combinations of memory banks mounted in the first memory mounting region 11 and the second memory mounting region 12 of the mother board 10. FIG. 6 is a diagram for explaining a setting of the total capacity of the main memory.

For example, when the vender performs a setting such that only the first memory bank 21 is mounted in the first memory mounting region 11, the total capacity of the main memory is as follows:

$$64 \text{ Mbit} \times 4 \rightarrow 32 \text{ Mbyte} \quad (1)$$

When the vender performs a setting such that the first memory banks 21 are mounted in the first memory mounting region 11 and the second memory mounting region 12, respectively, the total capacity of the main memory is as follows:

$$64 \text{ Mbit} \times 8 \rightarrow 64 \text{ Mbyte} \quad (2)$$

When the vender performs a setting such that only the second memory bank 22 is mounted in the first memory mounting region 11, the total capacity of the main memory is as follows:

$$128 \text{ Mbit} \times 4 \rightarrow 64 \text{ Mbyte} \quad (3)$$

When the vender performs a setting such that the first memory bank 21 is mounted in one of the first memory mounting region 11 and the second memory mounting region 12 and when the second memory bank 22 is mounted in the other, the total capacity of the main memory is as follows:

$$(64 \text{ Mbit} \times 4) + (128 \text{ Mbit} \times 4) \rightarrow 96 \text{ Mbyte} \quad (4)$$

When the vender performs a setting such that the second memory banks 22 are mounted in the first memory mounting region 11 and the second memory mounting region 12, respectively, the total capacity of the main memory is as follows:

$$128 \text{ Mbit} \times 8 \rightarrow 128 \text{ Mbyte} \quad (5)$$

In this manner, the vender can select the total capacity of the main memory from the five patterns (1) to (5).

In FIG. 5, 440DX PCI set 82443DX Host Bridge/Controller available from Intel Corp. in the U.S.A. is used as the memory controller 23 in this embodiment. The memory controller 23 detects the types of the memory banks mounted in the first memory mounting region 11 and the second memory mounting region 12 to detect the total amount of the main memory.

More specifically, the memory controller 23 is started when the personal computer is powered on to perform the following memory check process. First, the memory controller 23 gives a write instruction "0" or "1" to all the address lines connected to the DRAMs constituting the first bank (mounted in the first memory mounting region 11), i.e., the first wires 31 and the second wires 32.

At this time, when the memory bank mounted in the first memory mounting region 11 is the first memory bank 21, the first memory bank 21 is electrically connected to the second wires 32. For this reason, the first memory bank 21 cannot receive the write instruction from the memory controller 23. Therefore, the write instruction is neglected.

In contrast to this, when the memory bank mounted in the first memory mounting region 11 is the second memory bank 22, the second memory bank 22 writes "0" or "1" at a predetermined address in accordance with the write instruction received from the second wires 32.

Thereafter, the memory controller 23 gives a read instruction for reading "0" or "1" written in accordance with the write instruction to the first wires 31 and the second wires 32. Thereafter, the memory controller 23 waits for a response to the read instruction.

At this time, the memory bank mounted in the first memory mounting region 11 is the first memory bank 21, the first memory bank 21 cannot return "0" or "1" to the memory controller 23 in accordance with the read instruction. In contrast to this, when the memory bank mounted in the first memory mounting region 11 is the second memory bank 22, the second memory bank 22 can give "0" or "1" written at a predetermined address to the memory controller 23 in accordance with the read instruction received from the second wires 32.

Therefore, when the read results corresponding to write instructions output to all the address lines (the first wires 31 and the second wires 32) of the first bank are not returned, the memory controller 23 recognizes that the memory bank (memory bank mounted in the first memory mounting region 11) constituting the first bank is the first memory bank 21, and recognizes that the storage capacity of the first bank is 32 Mbyte.

In contrast to this, when the read results corresponding to the write instructions output to all the address lines of the first bank are returned, the memory controller 23 recognizes that the memory bank (memory bank mounted in the first memory mounting region 11) constituting the first bank is the second memory bank 22, and recognizes that the storage capacity of the first bank is 64 Mbyte.

Thereafter, the memory controller 23 executes the above process to the second bank to detect the storage capacity of the second bank. The storage capacity of the first bank and the storage capacity of the second bank to detect the total capacity of the main memory.

The detection results are notified to a processor or a controller such as a CPU as needed, and the processor or the controller which receives notification manages/uses the main memory in accordance with the notified total capacity of the main memory.

In the mother board 10 according to the embodiment described above, two types of memory banks, i.e., the first memory bank 21 and the second memory bank 22 can be mounted as the first bank. For this reason, the vender can select the total capacity of the main memory from the patterns (1) and (3).

The first bank and the second bank are prepared for the mother board 10, and two types of memory banks can be mounted as the first and second banks. For this reason, the vender can select the total capacity of the main memory from the patterns (1) to (5).

For this reason, before a personal computer on which the mother board 10 is mounted is shipped, the vender acquires a demand of a user who purchases the personal computer. The vender mounts a main memory having a total capacity depending on the demand on the personal computer and ships the personal computer, so that the personal computer depending on the demand of the user can be supplied to the user.

In addition, after market research or the like is performed, five types of personal computers in which only the total capacities of the main memories are different from each other are prepared and shipped, so that personal computers depending on the demands of users can be supplied.

Although the total capacity of the memory of pattern (2) is equal to the total capacity, the mounted memory banks of the patterns (2) and (3) are different from each other. Since the memory bank of 64 Mbit×4 and the memory bank of 128 Mbit×4 are different from each other in price, the setting of the prices of personal computers can be changed. For this reason, a vender can respond to the demands of a large number of users.

In this manner, according to this embodiment, a main memory having a total storage depending on the request of a user can be mounted on one type of mother board 10. For this reason, a mother board depending on the total capacity of the main memory need not be prepared. Loads on the cost and the time of a vender are reduced.

In this embodiment has described the case in which the present invention is applied to a mother board as a wiring board. However, the present invention can be applied to not only a mother board but also a wiring board for a memory module on which memory elements are mounted.

What is claimed is:

1. A wiring board comprising:
   a plurality of sockets alternatively mountable to one of first and second memories having different storage capacities, the memories being permanently mounted with the sockets;
   first wires being provided with each of said sockets and for, when the first memory is mounted with any one of said sockets, making it possible to access all addresses of the first memory; and
   second wires being provided with each of said sockets and for, when the second memory is mounted with any one of said sockets, making it possible to access to all addresses of the second memory.

2. A wiring board according to claim 1, wherein the sockets are formed on both the surfaces of the wiring board.

3. A wiring board according to claim 1, wherein the first memory comprises a plurality of storage elements,
   the first wires are electrically connected to the storage elements comprising the first memory,
   the second memory comprises a plurality of storage elements, having the same bit configurations as those of the storage elements comprising the first memory, the number of which is equal to that of the storage elements of the first memory, and
   the second wires are electrically connected to the storage elements comprising the second memory.

4. A wiring board according to claim 1, wherein the first wires and the second wires have portions which are commonly used for the first memory and the second memory.

5. An electronic device comprising a wiring board, wherein
   the wiring board includes a plurality of sockets in which memories having different storage capacities can be permanently mounted, and
   the sockets each comprise:
      first wires for, when a first memory is mounted, making it possible to access all the addresses of the first memory; and
      second wires for, when a second memory having a storage capacity different from that of the first memory, making it possible to access to all the addresses of the second memory.

6. A wiring board comprising:
   a first memory;
   a second memory, having a storage capacity different from a storage capacity of the first memory;
   a plurality of sockets permanently mountable to the first and second memories, respectively;
   first wires to connect the first memory and the respective socket; and
   second wires to connect the second memory and the respective socket.

7. A wiring board comprising:
   a plurality of sockets alternatively mountable to one of first and second memories having different storage capacities, the memories being mounted to the sockets;
   first wires being provided with each of said sockets and for, when the first memory is mounted with any one of said sockets, making it possible to access all addresses of the first memory; and
   second wires being provided with each of said sockets and for, when the second memory is mounted with any one of said sockets, making it possible to access to all addresses of the second memory.

* * * * *